United States Patent [19]

Saxe

[11] Patent Number: 4,647,922
[45] Date of Patent: Mar. 3, 1987

[54] DIGITAL OSCILLOSCOPE DISPLAY SYSTEM EMPLOYING INTERPOLATED INFORMATION

[75] Inventor: Charles L. Saxe, Beaverton, Oreg.

[73] Assignee: Tektronix, Inc., Beaverton, Oreg.

[21] Appl. No.: 579,619

[22] Filed: Feb. 13, 1984

[51] Int. Cl.⁴ .............................................. G09G 1/06
[52] U.S. Cl. ................................... 340/721; 340/722; 340/734; 340/747; 315/383; 324/121 R
[58] Field of Search ............... 340/722, 728, 744, 747, 340/721, 734; 324/121 R; 315/383; 364/723

[56] References Cited

U.S. PATENT DOCUMENTS

| | | | |
|---|---|---|---|
| 4,068,310 | 1/1978 | Friauf | 340/722 |
| 4,251,814 | 2/1981 | Dagostino | 340/722 |
| 4,263,593 | 4/1981 | Dagostino et al. | 340/722 |
| 4,464,656 | 8/1984 | Nakamura | 340/722 |

*Primary Examiner*—Gerald L. Brigance
*Assistant Examiner*—Jeffery A. Brier
*Attorney, Agent, or Firm*—John P. Dellett; George T. Noe

[57] ABSTRACT

A digital oscilloscope provides sine interpolation between sampled data points and includes means for intensifying the cathode-ray-tube display to emphasize portions of the cathode-ray-tube trace corresponding to original samples while deemphasizing portions of the trace representing interpolated information.

9 Claims, 6 Drawing Figures

DIGITAL OSCILLOSCOPE DISPLAY SYSTEM EMPLOYING INTERPOLATED INFORMATION

BACKGROUND OF THE INVENTION

The present invention relates to a digital oscilloscope and method of operation, and particularly to such an oscilloscope and method of operating the same which pemits the user to differentiate between original sampled data and interpolated information.

A conventional digital storage oscilloscope samples an input waveform at a large number of sample points, converts the analog sample information to digital form, and stores the resulting digital information in computer memory. The digital information is repeatedly retrieved and re-converted to analog form for presentation on the screen of a cathode-ray-tube.

The digitized samples of the input waveform represent discrete points on the waveform and in order to avoid presentation of a discontinuous trace consisting only of these points, some kind of interpolation mechanism is frequently employed to provide an interpolated trace between the original points. A suitable interpolator comprises a sine interpolator, or one having a sin x/x characteristic adapted to provide a smooth or sine-wave-like trace between the original data points. However, the same interpolator that correctly portrays sine wave information from memory also introduces what appears like pre-shooting and over-shooting on pulse information or information having rapid rise and fall times. Over-shoot and ringing can obscure the true waveform.

As one possible solution, a digital storage oscilloscope can be provided with more than one interpolator, for example one interpolator for sine wave information and another with good pulse response but lacking in ability to interpolate sine waves. The user of the oscilloscope must choose between the two different waveform displays for the same acquired data sequence, and neither display may be entirely accurate.

SUMMARY OF THE INVENTION

In accordance with the present invention in a preferred embodiment thereof, a digital oscilloscope includes sine interpolation for interpolating between original sample values and a graphic display such as a cathode-ray-tube which is responsive in trace presentation to both the original values and the interpolated values. The trace of the graphic display means is selectively modulated in synchronism with presentation the original samples to distinguish portions of the trace responsive to the original samples from portions of the trace produced by interpolation. In a preferred embodiment, the Z-axis of the cathode-ray-tube is modulated to provide a greater trace intensity for the portions of the trace corresponding to the original samples, while a variable lesser intensity of the trace portrays interpolation values. The degree of differentiation between the trace portions is adjustable.

It is accordingly an object of the present invention to provide a digital oscilloscope with an improved presentation differentiating between original sampled information and interpolated information.

It is another object of the present invention to provide an improved digital oscilloscope that does not require a plurality of interpolation devices.

It is another object of the present invention to provide an improved method for operating a digital oscilloscope for viewing original data separately from interpolated data.

The subject matter which I regard as my invention is particularly pointed out and distinctly claimed in the concluding portion of this specification. The invention, however, both as to organization and method of operation, together with further advantages and objects thereof, may best be understood by reference to the following description taken in connection with the accompanying drawings wherein like reference characters refer to like elements.

DRAWINGS

FIG. 1 is a diagram, partially in block form and partially in schematic form, illustrating a digital oscilloscope circuit incorporating the present invention, FIG. 2 is a diagram, partially in block form and partially in schematic form, further illustrating a portion of the FIG. 1 circuit in an analog embodiment thereof, FIG. 3 is a diagram, partially in block form and partially in schematic form, further illustrating a portion of the FIG. 1 circuit in a digital embodiment thereof, FIG. 4 illustrates a "square" waveform as depicted on a digital cathode-ray-oscilloscope having sine interpolation, FIG. 5 illustrates a waveform display of the type produced according to the present invention wherein original data is emphasized as compared with interpolated data, and FIG. 6 illustrates a waveform presentation incorporating only original data samples.

DETAILED DESCRIPTION

Figure 1:
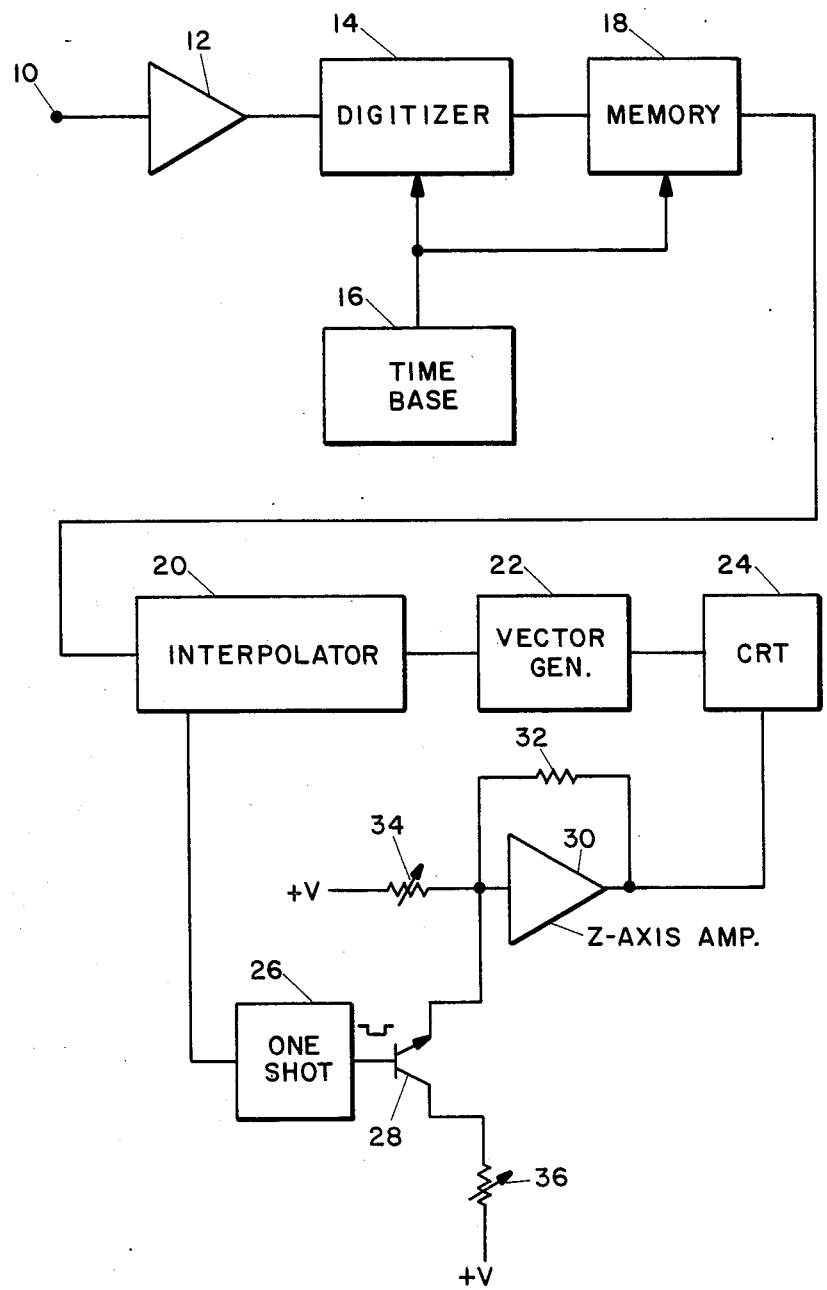

Referring to the drawings, FIG. 1 illustrates a portion of a digital storage oscilloscope or combination digital storage and conventional analog oscilloscope incorporating the present invention. An input signal received at terminal 10 is amplified by input amplifier 12 and recieved by digitizer or analog-to-digital converter 14 where the input is transformed into a number of digital samples successively representative of the amplitude of the input waveform. Digitizing thus consists of sampling and quantizing the input information. Time base 16 is operated by a precise digital clock to time the analog-to-digital conversion process and store the data in digital memory 18. The rate at which this occurs is the digitizing rate or sampling rate of the device. Once the data is stored in digital memory 18, it can be read out at a desired rate and reconstructed for display.

In the circuit of FIG. 1, information in memory 18 is read out and supplied to interpolator 20 which generates additional points or values between the sample values intially stored in memory 18, and these interpolated values are interspersed between the original sample values for application to vector generator 22. Vector generator 22 "connects" or in effect draws lines between the successive sample values and interpolated values to provide an output for operating the deflection apparatus of graphic display means 24, suitably comprising a cathode-ray-tube. The cathode-ray-tube 24 and/or vector generator 22 are also responsive to horizontal displacement information or time base sweep control in a conventional manner.

Figure 4:
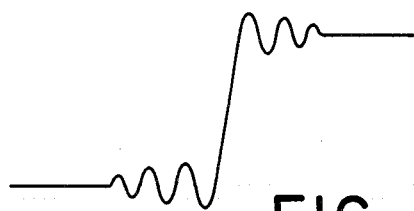
Figure 6:
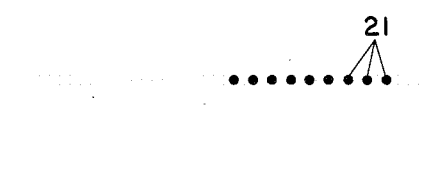

Interpolator 20 comprises a sine interpolator, i.e. an interpolator principally designed for reproducing sine waves or information having principally sine wave content. Consequently, an input signal having sine wave content (at frequencies below a predetermined frequency equaling half the digitizing rate) will be accurately portrayed utilizing the sine interpolator. However, square waves or input waveforms having rapid rise or fall times result in ringing or what appears like pre-shooting and over-shooting at the pulse edges. FIG. 4 illustrates a display of a square wave as displayed on cathode-ray-tube 24 in FIG. 1 after interpolating by sine interpolator 20. The actual original samples of the input square wave are shown in FIG. 6 and comprise a series of "dots", e.g. at 21, that accurately depict the square wave.

Figure 5:
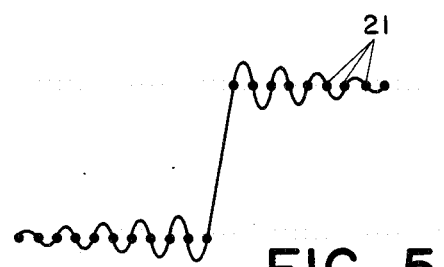

In accordance with the present invention, Z-axis modulation of the cathode-ray-tube 24 is controlled or the cathode-ray-tube's electron beam is modulated in a manner such that interpolated information is decoupld from the original sampled points, for example as illustrated in FIG. 5. This method of display offers significant advantages over a continuous display, e.g. the display in FIG. 4, since the viewer always knows which display points were original data points and which points were added by the system. In the case of the square wave, the original points show the fast rise time with no over-shoot or ringing. From the original points, the user can make best possible rise time measurements and can easily tell if the waveform contained a significant amount of actual ringing below the Nyquist rate.

Referring again to FIG. 1, the invention is implemented employing one-shot multivibrator 26 driving transistor 28 which has its emitter connected to the input terminal of Z-axis operational amplifier 30. Amplifier 30 controls the electron gun of cathode-ray-tube 24, or other intensity determining means, and is provided with a feedback resistor 32, and a first, variable input resistor 34 coupling the input terminal of amplifier 30 to a positive voltage. The collector of transistor 28 is connected to the same positive voltage by way of a second, variable input resistor 36.

The one-shot multivibrator 26 is responsive to the reading out of original samples from memory 18 and generates a negative going output pulse having a predetermined duration. The timing of the input supplied to multivibrator 26 is determined to be substantially coincident with the depiction of the waveform portions on cathode-ray-tube 24 corresponding to the original sample values.

When the negative pulse output of one-shot multivibrator 26 is applied to transistor 28, the transistor is cut off and only input resistor 34 is left in the circuit. Resistor 34 is employed for adjusting the intensity of the original sample points. After the time-out of one-shot multivibrator 26, transistor 28 returns to conduction and the intensity of the trace will also be governed by the adjustable value of resistor 36 in parallel with resistor 34. The gain of the amplifier is proportional to the negative ratio of the feedback resistance to the input resistance, so with resistor 36 added in parallel with input resistor 34, the output of the amplifier will increase in a negative sense, causing the trace to be less bright.

The circuit is arranged such that the intensity of the dots representing the input samples is relatively constant as controlled by adjustment of first input resistor 34, while second input resistor 36 is adjusted to vary the intensity of the trace between the dots as illustrated in FIG. 5. As a matter of fact, the resistance of resistor 36 can be lowered so the interpolated portion of the trace disappears entirely leaving only the original sample dots as illustrated in FIG. 6, or its resistance can be increased such that the whole trace has the same intensity as illustrated in FIG. 4.

Figure 2:
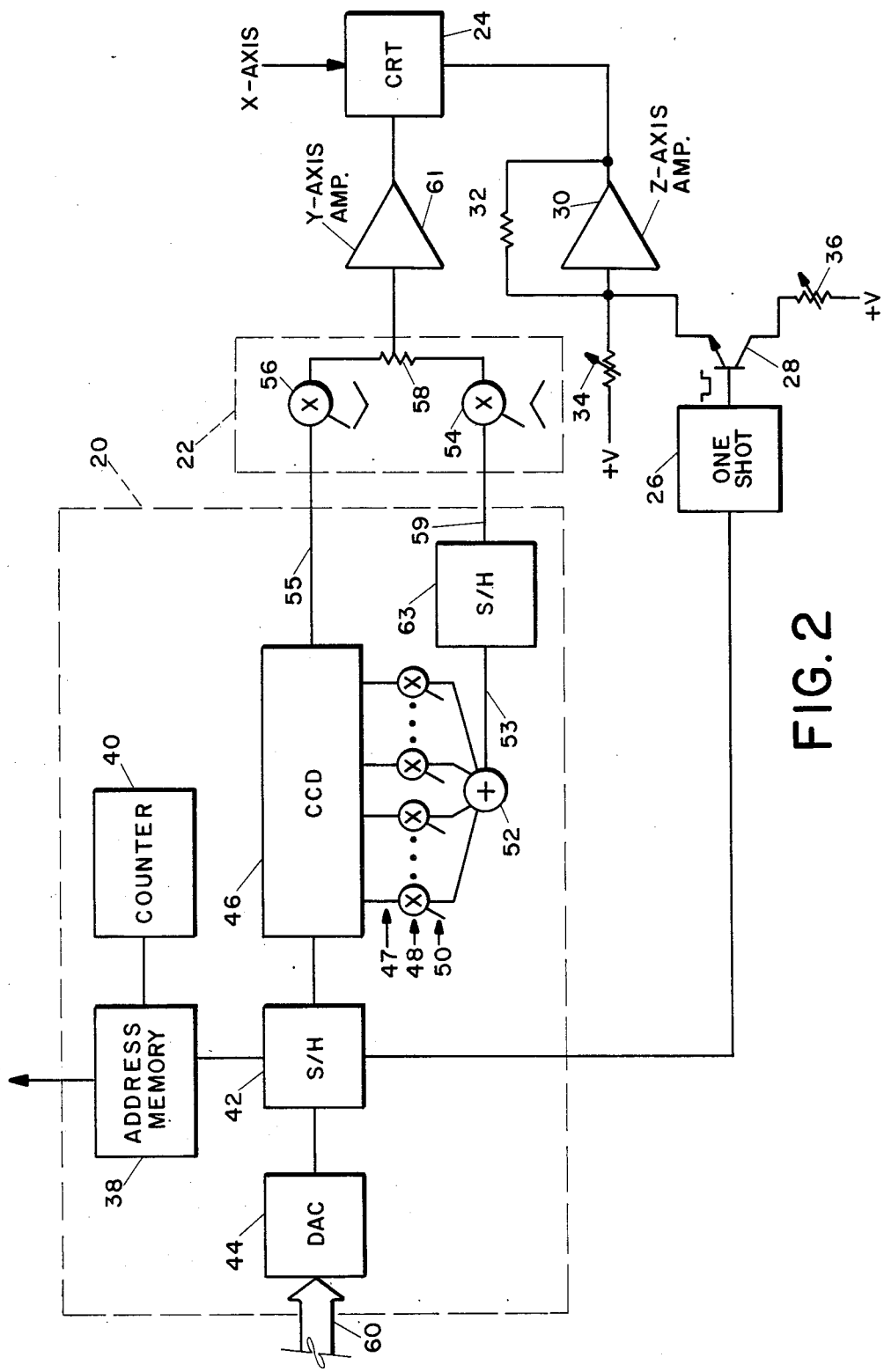

Referring to FIG. 2, a circuit is illustrated including analog implementation of the interpolator and vector generator of FIG. 1. The interpolator 20 suitably includes a memory address register 38 receiving the output of counter 40 for addressing successive memory locations in digital memory 18 (in FIG. 1) at which original input samples are stored as digital numbers. The digital values thus addressed are provided on bus 60 to digital-to-analog converter 44 incorporating sample and hold circuit 42. Operation of sample and hold circuit 42 is synchronized with operation of memory address register 38 so that the analog values successively provided are temporarily held for supplying successive inputs to charge-coupled-device 46. One-shot multivibrator 26 is operated in synchronism with the timing of the application of successive "original" samples to charge-coupled-device 46 from circuit 42.

Charge-coupled-device 46 suitably comprises a TAD-32 tapped analog delay line or bucket brigade device manufactured by Reticon Corporation, Sunnyvale, Calif. The bucket brigade stages have output taps 47, with only four of thirty-two taps being shown in the drawing for purposes of clarity. Analog charges are shifted along delay line 46, at the rate new analog information values are presented thereto from sample and hold circuit 42, by means of shifting circuitry (not shown).

Each of the taps 47 of charge-coupled-device 46 is connected to a summing circuit 52 via a multiplier 48 adapted to receive a multiplying factor on a lead 50. In a customary version of the Reticon TAD-32 device, the multiplying factors can be presented by adjustment of a plurality of potentiometers. Multipliers 48 are indicated herein for explanatory purposes. The profile of the multiplying factors at leads 50 suitably approximates a sin x/x characteristic so as to provide sin x/x interpolation.

The result of interpolation, as between a pair of original samples, is provided on output lead 53 of summing circuit 52 and applied via sample and hold circuit 63 as one input to vector generator 22. Vector generator 22 suitably receives a second input on lead 55 from a selected tap along the delay line of charged-coupled-device 46, e.g. a nearly central tap representing an original sample point next adjacent the sequential position of the interpolated point information provided on lead 53.

Vector generator 22 may comprise any suitable vector generating circuit, but is disclosed herein for purposes of explanation as comprising a pair of multipliers 54 and 56 respectively receiving analog inputs on leads 59 and 55 and providing a common output by way of summing resistor 58 to Y-axis amplifier 61 which drives the vertical deflection means of cathode-ray-tube 24. Multipliers 54 and 56 receive increasing and decreasing ramp waveforms, respectively, as multiplying factors such that the output from summing circuit 58 smoothly changes from the value presented at lead 55 to the value received from sample and hold circuit 63. During an immediately following portion of the cycle, the ramp waveforms are reversed whereby the common output shifts back to the value on lead 55. Meanwhile, information has stepped one position along charge-coupled-device 46.

As mentioned, the Y-axis amplifier 61 is connected to operate the vertical deflection apparatus of cathoderay-tube 24. The Z-axis of the cathode-ray-tube is driven from Z-axis amplifier 30 and operates in the manner hereinbefore described. In the circuit illustrated, cathode-ray-tube 24 suitably receives its X-axis deflection or time base sweep input from a sweep generator (not shown) operated in synchronism with presentation of the waveform samples and interpolated information.

Figure 3:
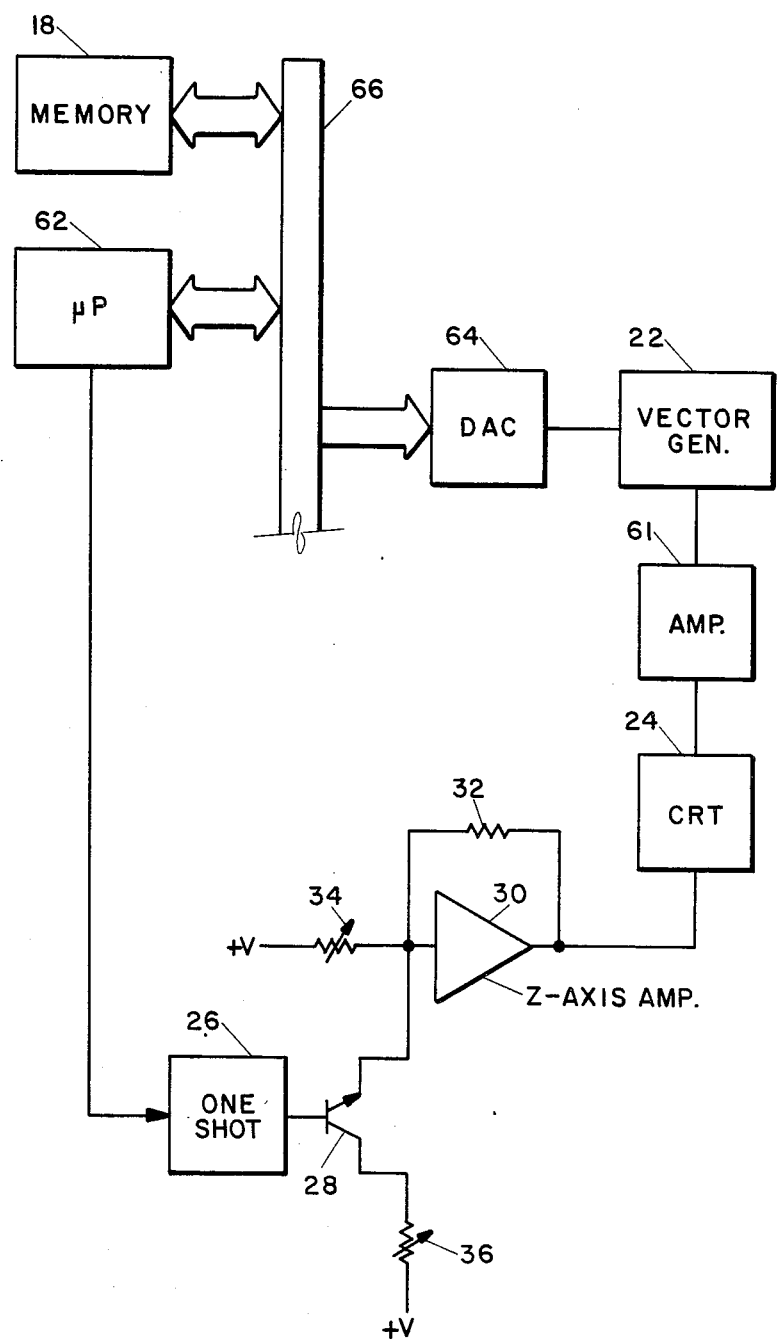

Another circuit configuration for a portion of an oscilloscope utilizing the present invention is illustrated in FIG. 3. In this circuit, sin x/x interpolation between original sampled points is accomplished employing microprocessor 62. Sampled points stored in memory 18' are appropriately averaged to provide interpolated values between the original points, and the interpolated values are also stored in memory 18'. Then, the original and interpolated information from memory 18' is coupled via bus 66 to vector generator 22' via digital-to-analog converter 64. The output of the vector generator operates the deflection means of cathode-ray-tube 24 by way of amplification means 61' and may control both the vertical and horizontal deflection of the cathode-ray-tube in accordance with the vectors specified.

The Z-axis amplifier 30 and associated circuitry for selectively emphasizing the original data points as compared with the interpolation information operates in the same manner as hereinbefore described. It will be observed that the FIG. 3 circuit corresponds in function with the circuit described in connection with FIG. 1, but wherein the interpolation task is accomplished in a manner conventional to digital oscilloscopes by microprocessor 62. One-shot multivibrator 26 is synchronized in its operation by microprocessor 62 such that Z-axis amplifier 30 changes the intensity of the cathode-ray-tube trace in synchronism with the presentation of original data points as opposed to interpolated information.

Although modulation of the cathode-ray-tube presentation in respect to intensity is described herein as the method of bringing out original data in the trace as compared with interpolated data, it will be appreciated that other forms of modulation or presentation of the trace output can be utilized to distinguish the original data and interpolated information. For example, the color of the output trace can be modulated in a color CRT so that orginal data is presented in a different color from interpolated information.

While I have shown and described preferred embodiments of my invention, it will be apparent to those skilled in the art that many other changes and modifications may be made without departing from my invention in its broader aspects. I therefore intend the appended claims to cover all such changes and modifications as fall within the true spirit and scope of my invention.

I claim:

1. A digital oscilloscope adapted to sample an input signal and provide sample related values for presentation of a trace on graphic display means, comprising:
    means for interpolating between said sample related values for providing interpolated values, said graphic display means being responsive to both the sample related values and interpolated values to form a more continuous trace;
    and means operating in synchronism with said presentation of a trace and in response to said sample related values for modulating said trace to distinguish portions of said trace responsive to said sample related values as compared with said interpolated values.

2. A digital oscilloscope adapted to sample an input signal for storage and presentation on a cathode-ray-tube screen with interpolation between samples, comprising:
    means for providing Z-axis modulation of said cathode-ray-tube's electron beam,
    and means responsive to sampled values for controlling said Z-axis modulation means to increase the intensity of the trace representative of said sampled values as compared with interpolated values between sampled values.

3. A digital oscilloscope adapted to sample an input signal for storage in memory means and presentation on a cathode-ray tube screen with interpolation between samples, comprising:
    means for providing Z-axis modulation of said cathode-ray tube's electron beam,
    and means responsive to readout of sampled values from said memory means for controlling said Z-axis modulation means to increase the intensity of the trace portion representative of each sample for a predetermined time period thereby to distinguish samples from interpolation.

4. The oscilloscope according to claim 3 wherein said Z-axis modulation means includes an operational amplifier, and said means responsive to readout of sampled values comprises a one-shot multivibrator and transistor means actuated thereby for increasing the input resistance of said operational amplifier.

5. The oscilloscope according to claim 4 wherein said operational amplifier is provided with a first variable input resistor, and wherein said means responsive to readout of sampled values comprises a second variable input resistor in series with said transistor means and the input terminal of said operational amplifier.

6. A digital oscilloscope adapted to sample an input signal for storage in memory means and presentation on a cathode-ray tube screen, comprising:
    means for providing Z-axis modulation of said cathode-ray tube's electron beam,
    sine wave interpolation means responsive to stored values for providing interpolated values therebetween, said cathode-ray tube receiving the output of said interpolation means to provide a trace presentation of both the stored values and the interpolated values therebetween,
    and means synchronized with presentation of trace portions representative of said stored values for controlling said Z-axis modulation means to increase the intensity of such trace portions.

7. A digital oscilloscope adapted to sample an input signal and store corresponding digital values in memory means for reconversion to analog values and presentation on a cathode-ray-tube screen, comprising:
    means for providing Z-axis modulation of said cathode-ray-tube's electron beam,
    sine wave interpolation means responsive to said digital values for providing interpolated values therebetween, said cathode-ray-tube being responsive in trace presentation both to said digital values and interpolated values therebetween,
    and means synchronized with presentation of trace portions representative of said digital values on said cathode-ray-tube screen for controlling said Z-axis modulation means to increase the intensity of such trace portions.

8. The method of operating a digital oscilloscope having a memory in which sample values representative of samples of an input signal are stored and graphic display means on which a trace representative of said samples is presented, said method comprising the steps of:

interpolating between said sample values to provide interpolated values and causing said trace to represent said interpolated values as well as the sample values, and modulating the trace of said graphic display means in synchronism with the presentation of said sample values to distinguish portions of said trace produced by said sample values from said interpolated values.

9. The method of operating a digital oscilloscope having a memory in which digital values representative of samples of an input signal are stored and a cathode-ray tube on which a trace representative of said samples is presented, said method comprising the steps of:

sine wave interpolating between said digital values to provide interpolated values and causing said trace to represent said interpolated values as well as the digital values, and relatively increasing the intensity of the trace of said cathode-ray tube representative of said digital values as compared with the representation of said interpolated values.

* * * * *